United States Patent
Hamano

(10) Patent No.: US 12,160,202 B2
(45) Date of Patent: Dec. 3, 2024

(54) AMPLIFYING DEVICE

(71) Applicant: SUMITOMO ELECTRIC INDUSTRIES, LTD., Osaka (JP)

(72) Inventor: Koshi Hamano, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 479 days.

(21) Appl. No.: 17/455,265

(22) Filed: Nov. 17, 2021

(65) Prior Publication Data
US 2022/0182018 A1    Jun. 9, 2022

(30) Foreign Application Priority Data
Dec. 9, 2020    (JP) .................................. 2020-204353

(51) Int. Cl.
*H03G 3/20*    (2006.01)
*H03F 1/32*    (2006.01)
(Continued)

(52) U.S. Cl.
CPC .............. *H03F 1/32* (2013.01); *H03F 3/245* (2013.01); *H03F 1/0222* (2013.01); *H03F 2200/451* (2013.01)

(58) Field of Classification Search
CPC ...... H03F 1/32; H03F 3/245; H03F 2200/451; H03F 1/3276; H03F 3/193; H03F 3/211; H03F 1/565; H03F 3/195; H03F 3/213; H03F 1/0222; H03F 2200/102; H03G 3/3063; H03G 3/3042; H03G 3/20
(Continued)

(56) References Cited

U.S. PATENT DOCUMENTS 7,298,214 B2 * 11/2007 Lee ...................... H03G 1/0088
   330/136
7,519,337 B2 * 4/2009 Ito ......................... H03F 1/0205
   330/285

(Continued)

FOREIGN PATENT DOCUMENTS

| JP | 2002-111414 | 4/2002 |
| JP | 2003-060445 | 2/2003 |
| JP | 2016-015708 | 1/2016 |

OTHER PUBLICATIONS

M. Gavell, G. Granström, C. Fager, S. E. Gunnarsson, M. Ferndahl, H. Zirath, "An E-Band Analog Predistorter and Power Amplifier MMIC Chipset," IEEE Microwave and Wireless Components Letters, vol. 28, No. 1, pp. 31-33, Jan. 2018.

*Primary Examiner* — Khanh V Nguyen
(74) *Attorney, Agent, or Firm* — IPUSA, PLLC

(57) ABSTRACT

An amplifying device includes a radio frequency (RF) signal input terminal to which an RF signal is input, a buffer circuit, a linearizer including a transistor, a power amplifier, and a control circuit. The control circuit outputs a first gate voltage when a level of the RF signal input is a first level, the first gate voltage causing the transistor to perform a class B operation. The control circuit outputs a second gate voltage when the level of the RF signal is a second level higher than the first level, the second gate voltage causing the transistor to perform a class AB operation. Output impedance of the buffer circuit that is seen from an input side of the linearizer is set such that a reflection loss of the RF signal input from the buffer circuit to the linearizer is a predetermined level or less.

11 Claims, 7 Drawing Sheets

(51) Int. Cl.
*H03F 3/24* (2006.01)
*H03F 1/02* (2006.01)

(58) Field of Classification Search
USPC .......................................... 330/136
See application file for complete search history.

(56) References Cited

U.S. PATENT DOCUMENTS 8,004,357 B2 * 8/2011 Lee ...................... H03G 3/3042
330/136
2002/0039038 A1 4/2002 Miyazawa

* cited by examiner

AMPLIFYING DEVICE

CROSS-REFERENCE TO RELATED APPLICATIONS

This application claims priority to Japanese Patent Application No. 2020-204353, filed on Dec. 9, 2020, the entire subject matter of which is incorporated herein by reference.

BACKGROUND

1. Field of the Invention

The present disclosure relates to an amplifying device.

2. Description of the Related Art

In order to compensate for distortion in a level of an output signal relative to a level of an input signal of a power amplifier, there is a monolithic microwave integrated circuit (MMIC) chipset that includes an analog predistorter implemented by a transistor performing a class-c operation in accordance with the level of the input signal. The input signal of this MMIC chipset is in the E-band (see, for example, Non-Patent Document 1).

The MMIC chip is required to include an additional amplifier other than an analog predistorter and a power amplifier in order to increase a gain of a signal output from the power amplifier because the analog predistorter that performs a class-C operation has a low gain. In such a case, the size of a circuit device such as an MMIC chip increases.

Thus, it is desirable to provide a down-scaled amplifying device.

RELATED ART DOCUMENTS

Non-Patent Document

[Non-Patent Document 1] M. Gavell, G. Granström, C. Fager, S. E. Gunnarsson, M. Ferndahl, H. Zirath, "An E-Band Analog Predistorter and Power Amplifier MMIC Chipset," IEEE Microwave and Wireless Components Letters, Vol. 28, No. 1, pp. 31-33, January 2018.

SUMMARY

According to one aspect of the embodiment of the present disclosure, an amplifying device includes a radio frequency (RF) signal input terminal to which an RF signal is input, a buffer circuit that includes an input terminal connected to the RF signal input terminal, the RF signal being input to the buffer circuit through the input terminal, a linearizer connected to an output side of the buffer circuit, a power amplifier connected to an output side of the linearizer, and a control circuit. The linearizer includes a transistor including a control terminal. The transistor is provided in an input section of the linearizer. The control circuit outputs a first gate voltage to the control terminal when a level of the RF signal input to the RF signal input terminal is a first level, the first gate voltage causing the transistor to perform a class B operation. The control circuit outputs a second gate voltage to the control terminal when the level of the RF signal is a second level that is higher than the first level, the second gate voltage causing the transistor to perform a class AB operation. Output impedance of the buffer circuit that is seen from an input side of the linearizer is set such that a reflection loss of the RF signal input from the buffer circuit to the linearizer is less than or equal to a predetermined level.

BRIEF DESCRIPTION OF THE DIAGRAMS

DETAILED DESCRIPTION

Figure 1:
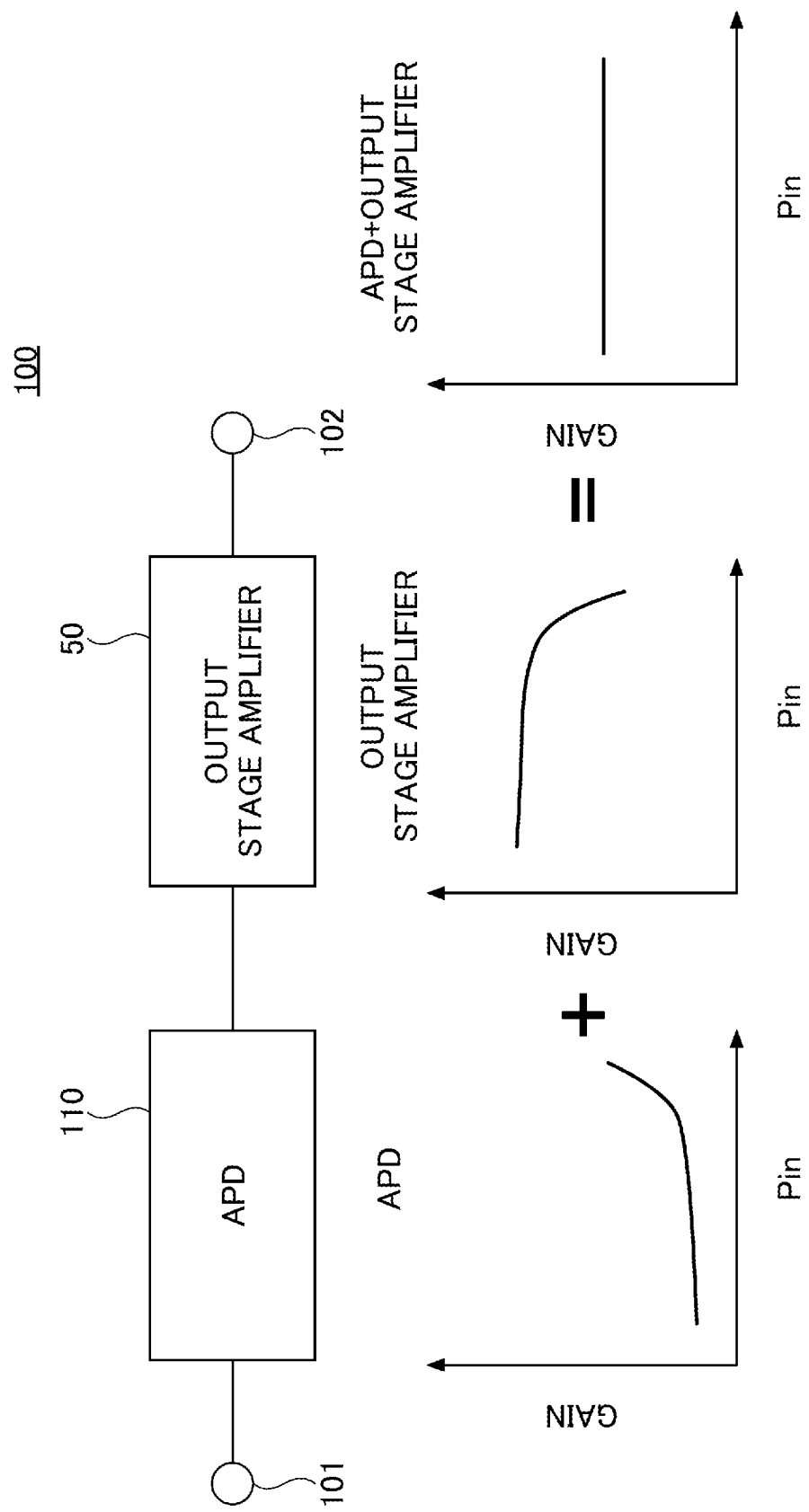
FIG. 1 is a diagram illustrating an example of a schematic configuration of an amplifying device 100 and a gain of each section.

An embodiment will be described below.

Description of the Embodiment of the Present Disclosure

[1] An amplification apparatus according to one aspect of the present disclosure includes a radio frequency (RF) signal input terminal to which an RF signal is input, a buffer circuit that includes an input terminal connected to the RF signal input terminal, the RF signal being input to the buffer circuit through the input terminal, a linearizer connected to an output side of the buffer circuit, a power amplifier connected to an output side of the linearizer, and a control circuit. The linearizer includes a transistor including a control terminal. The transistor is provided in an input section of the linearizer. The control circuit outputs a first gate voltage to the control terminal when a level of the RF signal input to the RF signal input terminal is a first level, the first gate voltage causing the transistor to perform a class B operation. The control circuit outputs a second gate voltage to the control terminal when the level of the RF signal is a second level that is higher than the first level, the second gate voltage causing the transistor to perform a class AB operation. Output impedance of the buffer circuit that is seen from an input side of the linearizer is set such that reflection loss of the RF signal input from the buffer circuit to the linearizer is less than or equal to a predetermined level.

The output impedance of the buffer circuit that is seen from the input side of the linearizer is set such that the reflection loss of the RF signal input from the buffer circuit to the linearizer is less than or equal to the predetermined level, so that a change occurring in the input impedance of the linearizer when performing the class B operation or the class AB operation is prevented from being transmitted to a stage prior to the buffer circuit. Additionally, by the control circuit outputting the first gate voltage to the control terminal when the level of the RF signal is the first level and outputting the second gate voltage to the control terminal when the level of the RF signal is the second level, the gain of the transistor increases when the level of the RF signal is the second level in comparison with when the level of the RF signal is the level of the first level. This causes the transistor to perform an operation such as the class C operation that increases the gain in the high-level region of the RF signal.

Further, because such an operation of the transistor is achieved by combining the class B operation and the class AB operation, a gain greater than the gain of the class C operation is obtained. Because a gain greater than the class C operation can be obtained, no additional amplifier is required. Therefore, a down-scaled amplifying device can be provided.

[2] In [1], the output impedance of the buffer circuit that is seen from the input side of the linearizer may be set such that the reflection loss is less than or equal to the predetermined level by the transistor performing the class B operation, an operation between the class B operation and the class AB operation, or the class AB operation, if the input impedance of the linearizer that is seen from the output side of the buffer circuit changes. When the transistor of the linearizer performs each operation, the output impedance of the buffer circuit is set, such that the reflection loss is less than or equal to the predetermined level, so that the RF signal can be efficiently input from the buffer circuit to the linearizer when the transistor of the linearizer performs any operation.

[3] In [1] or [2], the RF signal may be a signal in an E-band, and the predetermined level of reflection loss may represent a value of an upper limit level applicable to wireless communication in the E-band. Therefore, a good radio communication environment in which the reflection loss is low in the E-band is obtained.

[4] In any one of [1] to [3], the buffer circuit may include a first FET that includes a first gate terminal and a first drain terminal, the first gate terminal may be connected to the input terminal of the buffer circuit, and the first drain terminal may be connected to an output terminal of the buffer circuit. By using the first FET, the output impedance of the buffer circuit that is seen from the input side of the linearizer can be set with more certainty, such that the reflection loss of the RF signal input from the buffer circuit to the linearizer is less than or equal to the predetermined level, and by utilizing high isolation of the first FET, the change of the input impedance of the linearizer can be prevented with more certainty from being transmitted to a stage prior to the buffer circuit.

[5] In any one of [1] to [4], the transistor of the linearizer may include a second FET that includes a second gate terminal and a second drain terminal, and a third FET that includes a third gate terminal and a third drain terminal, the control terminal may be connected to the input terminal of the linearizer, the second gate terminal and the third gate terminal may be the control terminal, the second drain terminal and the third drain terminal may be connected to an output terminal of the linearizer, and a portion between the second gate terminal and the second drain terminal of the second FET and a portion between the third gate terminal and the third drain terminal of the third FET may be connected in parallel between the control terminal and the output terminal of the linearizer. The transistor of the linearizer includes the second FET and the third FET, and thereby obtaining a greater gain. With this configuration, an additional amplifier is not necessary and a down-scaled amplifier can be provided with more certainty.

[6] In any one of [1] to [5], the control circuit may include an input terminal connected to the RF signal input terminal, a first output terminal connected to the input terminal of the buffer circuit, a directional coupler including a second output terminal, an amplifier connected to the second output terminal, a rectifier connected to an output side of the amplifier, and a level shifter connected to an output side of the rectifier. The level shifter may be connected to the control terminal and may output the first gate voltage or the second gate voltage. The level shifter outputs the first gate voltage or the second gate voltage based on the output of the second output terminal of the directional coupler. Thus, by controlling the voltage of the control terminal of the linearizer in accordance with the signal level of the RF signal input to the input terminal, when the level of the RF signal is the first level, the transistor is caused to perform the class B operation, and when the level of the RF signal is the second level, the transistor is caused to perform the class AB operation. Therefore, it is possible to compensate for distortion of the input/output characteristics of the power amplifier with certainty, and a down-scaled amplifier can be provided.

[7] In [6], the amplifier may include a fourth FET that includes a fourth gate terminal connected to the second output terminal and a fourth drain terminal connected to the rectifier, and that amplifies an alternating current (AC) component of a signal input to the fourth gate terminal and outputs the amplified AC component from the fourth drain terminal. The AC component of the signal input from the second output terminal to the fourth gate terminal of the fourth FET of the amplifier is a signal that reflects the signal level of the RF signal. Thus, the fourth FET can amplify the AC component in accordance with the signal level of the RF signal and output the amplified AC component to the rectifier, and the transistor of the linearizer can perform the class B operation or the class AB operation with certainty in accordance with the signal level of the RF signal.

[8] In [7], the rectifier may include a capacitor connected to the fourth drain terminal of the fourth FET of the amplifier, a rectifying element connected to an output side of the capacitor, and a smoothing element connected to an output side of the rectifier, and the amplified AC component input from the fourth drain terminal may be rectified and output to the level shifter. Therefore, the direct current (DC) voltage that reflects the amplified AC component input from the fourth drain terminal of the fourth FET can be output to the level shifter, and the transistor of the linearizer is caused to perform the class B operation or the class AB operation with certainty in accordance with the signal level of the RF signal.

[9] In [8], the rectifying element may include a diode to which a line connecting the capacitor to the smoothing element is branched and connected, that is turned off when the level of the RF signal is the first level, and that is turned on when the level of the RF signal is the second level. Therefore, the level of the DC voltage output to the level shifter can be changed with certainty when the level of the RF signal is the first level and when the level of the RF signal is the second level, and the transistor of the linearizer can be caused to perform the class B operation or the class AB operation in accordance with the signal level of the RF signal.

[10] In [9], the level shifter may include a fifth FET that includes a fifth gate terminal connected to an output side of the smoothing element and a source terminal that is connected to the control terminal of the linearizer and to which the first gate voltage is applied, and the fifth FET may be turned off when the level of the RF signal is the first level and may be turned on when the level of the RF signal is the second level. Thus, the first gate voltage can be output from the source terminal when the RF signal is at the first level and the second gate voltage higher than the first gate voltage can be output from the source terminal when the RF signal is at the second level. Therefore, the transistor of the linearizer can be caused to perform the class B operation with certainty when the level of the RF signal is the first level, and the transistor of the linearizer can be caused to perform the class AB operation with certainty when the level of the RF signal is the second level.

[11] In any one of [1] to [10], a distributor, a coupler, and an RF signal output terminal may be further included, multiple series circuits may be included, and the buffer circuit, the linearizer, and the power amplifier may be connected in series in each of the multiple series circuits. The distributor may be connected between the RF signal input terminal and input terminals of the multiple buffer circuits, the coupler may be connected between the multiple power amplifiers and the RF signal output terminal, the multiple series circuits may be connected in parallel with each other between the distributor and the coupler, and the control circuit may output the first gate voltage or the second gate voltage to control terminals of transistors of the multiple linearizers. By connecting the multiple series circuits in parallel with each other between the distributor and the coupler, the gain that can be given to the RF signal input to the input terminal can be increased, and a down-scaled amplifier having a great gain can be provided.

Details of the Embodiment of the Present Disclosure

In the following, the embodiment of the present disclosure will be described in detail, but the present embodiment is not limited thereto. Here, in the present specification and the drawings, components having the substantially same functional configuration may be referenced by the same reference numeral and overlapped description may be omitted.

EMBODIMENT

Schematic Configuration of an Amplifying Device 100

FIG. 1 is a diagram illustrating an example of a schematic configuration of an amplifying device 100 and a gain of each section. The amplifying device 100 includes an RF signal input terminal 101, an RF signal output terminal 102, an analog predistorter (APD) 110, and an output stage amplifier 50. In FIG. 1, a configuration of the RF signal input terminal 101, the RF signal output terminal 102, the APD 110, and the output stage amplifier 50 is illustrated and the gain characteristics relative to the power Pin of the input signal (the Pin-Gain characteristics) at the APD 110, the output stage amplifier 50, and the RF signal output terminal 102 are respectively illustrated below the APD 110, the output stage amplifier 50, and the RF signal output terminal 102. The gain (dB) is a ratio of a power Pout (dBm) of an output signal to a power Pin (dBm) of an input signal in an amplifier such as the output stage amplifier 50.

The amplifying device 100 is provided, for example, in a mobile phone base station to amplify radio waves (RF signals) for transmission to a terminal such as a smartphone. In a mobile phone base station, for example, a large gain is required to enable the RF signal to be amplified by one amplifying device 100. Additionally, because a mobile phone base station transmits RF signals of multiple frequency bands (multiple bands), a wide frequency band (broadband) is required to enable RF signals of multiple bands to be amplified by one amplifying device 100, for example. The amplifying device 100 is used to amplify RF signals of frequency bands including, for example, the E-band (5 GHz from 71 GHz to 76 GHz and 5 GHz from 81 GHz to 86 GHz). The E-band RF signal is a RF signal of the millimeter band (for example, a frequency band from about 30 GHz to about 300 GHz). The E-band is a frequency band used in 5G (Fifth Generation). Additionally, the down-scaling of the amplifying device 100 is desired in order to improve the installation performance of the mobile phone base station.

The transistor or the field effect transistor (FET) described below is implemented by a GaAs-HEMT (a high electron mobility transistor), a GaN-HEMT, or the like, for example, that operates well in the millimeter-wave band.

The RF signal input terminal 101 is a terminal to which the RF signal for transmission is input. The APD 110 is connected to the RF signal input terminal 101. The output stage amplifier 50 is connected to an output side of the APD 110, and the RF signal output terminal 102 is connected to an output side of the output stage amplifier 50. The output stage amplifier 50 is, for example, an amplifier that performs a class AB operation and, in the Pin-Gain characteristic, as illustrated below the output stage amplifier 50, there are a linear region in which the gain is substantially constant with respect to the level of the power Pin of the input signal and a saturated region in which the gain saturates when the power Pin of the input signal increases to a certain extent. The amplification of the input signal with such a Pin-Gain characteristic increases a difference between saturated output power Psat and a 1 dB gain compression point P1 dB in the characteristic of the power Pout of the output signal with respect to the power Pin of the input signal of the output stage amplifier 50. Here, when the power Pin of the input signal continues to increase, the power Pout of the output signal of the amplifier converges (saturates) to a constant value. Such output power in which the level of the power Pout of the amplified output signal saturates is referred to as saturated output power Psat. Additionally, when the power Pin of the input signal continues to increase, the power Pout of the output signal observed when the power output from the amplifier drops by 1 dB relative to a characteristic, in which the power linearly and ideally increases, is referred to as the 1 dB gain compression point P1 dB. As the value of 1 dB gain compression point P1 dB increases, the linearity of the amplifier is improved.

The APD 110 has a Pin-Gain characteristic obtained by reversely distorting the Pin-Gain characteristic of the output stage amplifier 50 in the direction of the vertical axis representing the gain with respect to the horizontal axis representing the power Pin of the input signal, as illustrated below the APD 110 in FIG. 1. When the gain characteristic of the RF signal input from the RF signal input terminal 101 is distorted by this APD 110 and then is input to the output stage amplifier 50, the Pin-Gain characteristic of the RF signal output from the output stage amplifier 50 to the RF signal output terminal 102 becomes a characteristic in which an approximately constant gain is obtained, as illustrated below the RF signal output terminal 102, over a range from a low-level to a high-level of the power Pin of the input signal. That is, the APD 110 can reduce the difference between the saturated output power Psat and the 1 dB gain compression point P1 dB of the output stage amplifier 50. When the difference between the saturated output power Psat and the 1 dB gain compression point P1 dB is small, the value of the 1 dB gain compression point P1 dB is great. Additionally, when the value of the 1 dB gain compression point P1 dB becomes great, a value of a third order output intercept point (OIP3) becomes appropriate. Here, OIP3 is a third intercept point of the output of the amplifier. Specifically, when two signals with frequency bands close to each other are input to the amplifier at the same time, the third order intermodulation distortion (IM) appears as a third order distortion component. The third order intermodulation distortion component appears near the frequency bands of the two signals and affects the signal wave as a disturbing wave. The third order intermodulation distortion component increases as the level of the input signal increases. An output level value of an intersection point between a linear ideal characteristic of the output signal with respect to the input signal of the amplifier that is obtained when the amplifier is assumed not to be saturated and a characteristic that is obtained when the third order intermodulation distortion component of the amplifier is assumed to increase linearly is OIP3. Therefore, as OIP3 increases, the difference between the saturated output power Psat and the 1 dB gain compression point P1 dB decreases.

The APD 110 compensates for the Pin-Gain characteristic of the output stage amplifier 50 to flatten the Pin-Gain characteristic representing a relation of the gain given to the RF signal output from the RF signal output terminal 102 relative to the power Pin of the RF signal input to the RF input terminal 101. Thus, by providing the APD 110 at a stage prior to the output stage amplifier 50 (on the side near the RF signal input terminal 101), the amplifying device 100 can operate as a power amplifier having a high linearity and can linearly amplify the power in a range from a low level to a high level of the power Pin of the input signal. Here, the Pin-Gain characteristic of the RF signal output from the RF signal output terminal 102 with respect to the power Pin of the RF signal input to the RF input terminal 101 illustrated in FIG. 1 is substantially completely flat (linear), and is an ideal characteristic.

Pin-Gain Characteristic of the APD 110

Figure 2:
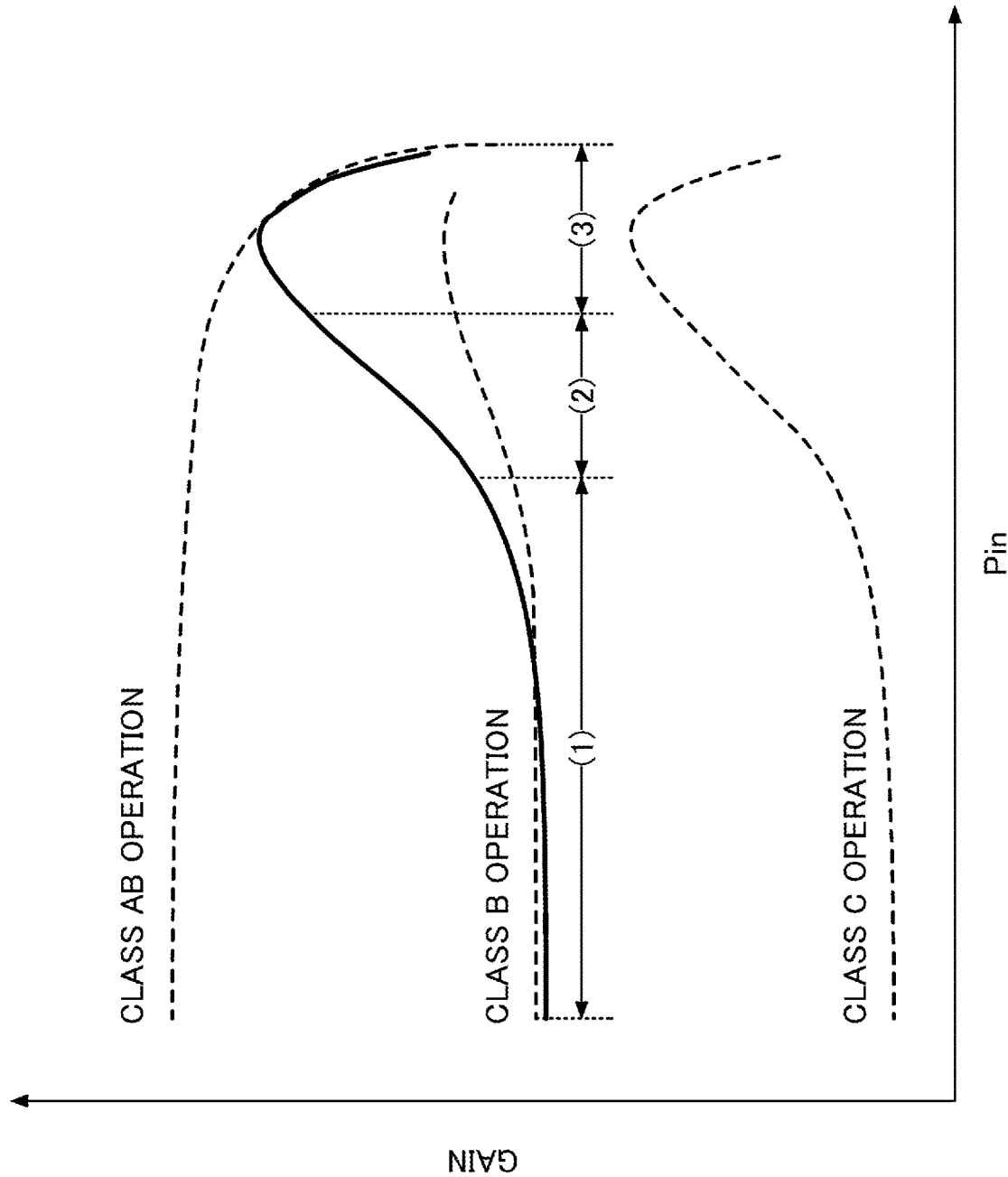
FIG. 2 is a graph illustrating an example of a Pin-Gain characteristic of an APD 110.

FIG. 2 is a graph illustrating an example of the Pin-Gain characteristic of the APD 110. FIG. 2 indicates the Pin-Gain characteristic of the APD 110 with the solid line, and the Pin-Gain characteristics of the class C operation, the class B operation, and the class AB operation with dotted lines. In the class C operation, the class B operation, and the class AB operation, the gain obtained for the power Pin of the input signal increases in this order due to differences in the operating points of the transistors. That is, the gain obtained by the class B operation is greater than the gain obtained by the class C operation, and the gain obtained by the class AB operation is greater than the gain obtained by the class B operation.

Here, the Pin-Gain characteristic obtained by reversely distorting the Pin-Gain characteristic of the class AB operation of the output stage amplifier 50 in the vertical axis direction representing the gain with respect to the horizontal axis representing the power Pin of the input signal may be a characteristic in which the gain is substantially constant from a region in which the power Pin of the input signal is low to a region in which the power Pin of the input signal increases to a certain extent, as with the class C operation, and the gain rapidly increases when the power Pin of the input signal increases to a certain extent.

The Pin-Gain characteristic obtained by reversely distorting the Pin-Gain characteristic of the class AB operation of the output stage amplifier 50 in the vertical axis representing the gain with respect to the horizontal axis representing the power Pin of the input signal can be achieved by combining, for example, a region in which a gain substantially constant with respect to the power Pin of the input signal is obtained in the class B operation and a region in which the gain rapidly increases with respect to the power Pin of the input signal in the class AB operation.

Thus, the APD 110 achieves the Pin-Gain characteristic illustrated by the solid line by using a transistor that performs the class B operation in a region (1) in which the power Pin of the input signal increases from a low region to a certain extent, that rapidly increases the gain by approaching the class AB operation from the class B operation in a region (2) in which the power Pin of the input signal is much greater than the power Pin in the region (1), and that performs the class AB operation in a region (3) in which the power Pin of the input signal is much greater than the power Pin in the region (2). The region (2) is a transitional region in which the class B operation transitions to the class AB operation and an operation between the class B operation and the class AB operation is performed. The gate voltage used when a transistor included in the APD 110 performs the class B operation is an example of a first gate voltage, and the gate voltage used when the transistor performs the class AB operation is an example of a second gate voltage.

The Pin-Gain characteristic illustrated by the solid line is a characteristic in which the region (1) in which a substantially constant gain is obtained by the class B operation, the region (2) in which the gain increases as an operation approaches the class AB operation from the class B operation, and the region (3) in which the gain is rapidly increased by the class AB operation are combined. The Pin-Gain Characteristic illustrated by the solid line combines the Pin-Gain Characteristics from the region (1) to the region (3) to achieve a change characteristic similar to the change characteristic of the Pin-Gain characteristic of the class C operation. Additionally, because the Pin-Gain characteristic illustrated by the solid line is achieved by the class B operation, a transitional operation between the class B operation and the class AB operation, and the class AB operation, a gain higher than that of the class C operation is obtained. The Pin-Gain characteristic illustrated by the solid line is an example of the Pin-Gain characteristic obtained by reversely distorting the Pin-Gain characteristic obtained by the class AB operation of the output stage amplifier 50 in the direction of the vertical axis representing the gain with respect to the horizontal axis representing the power Pin of the input signal.

Schematic Configuration and Pin-Gain Characteristic of the APD 110

Figure 3:
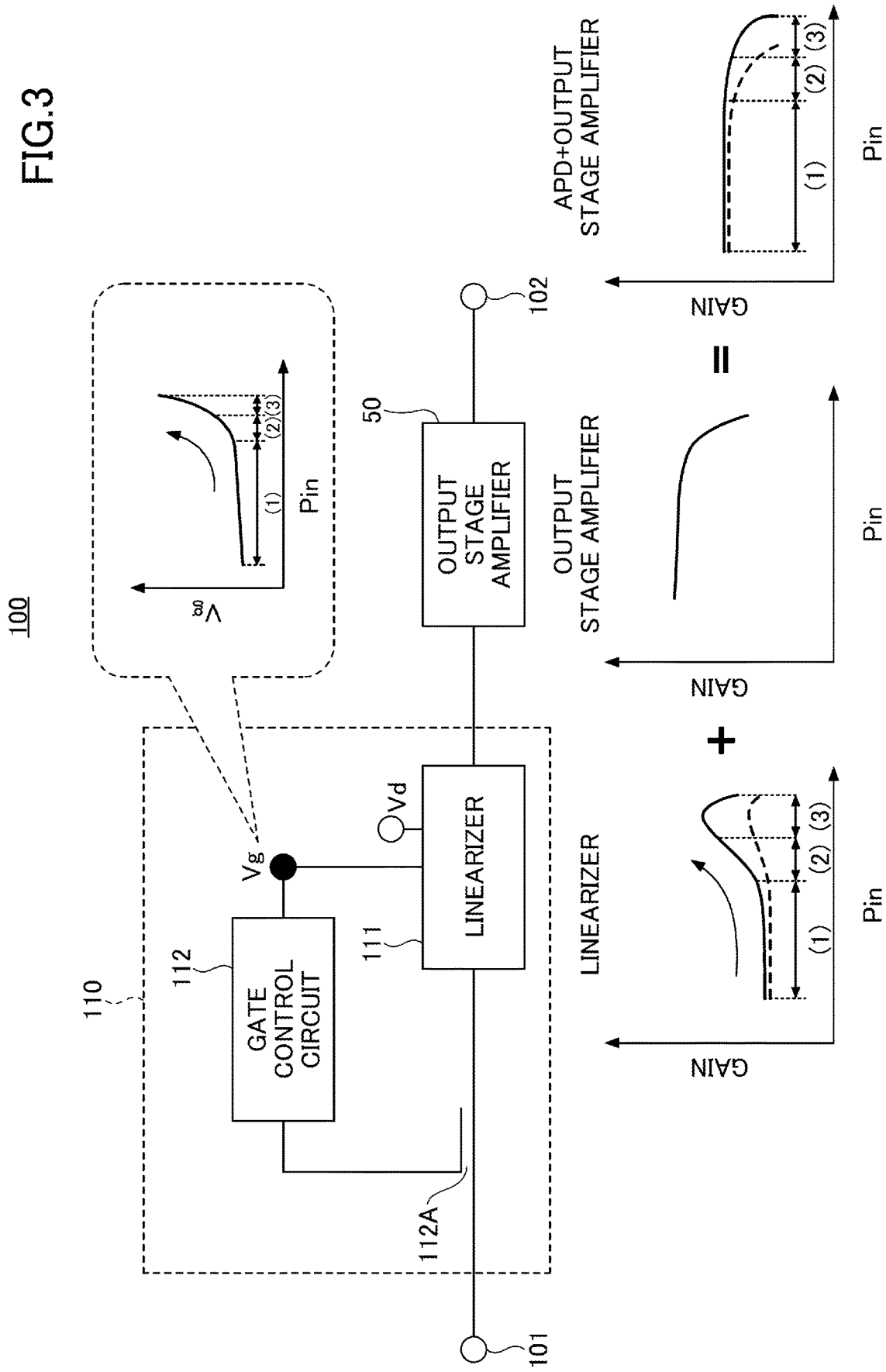
FIG. 3 is a simplified diagram illustrating an internal configuration of the APD 110.

FIG. 3 is a simplified diagram illustrating an internal configuration of the APD 110. FIG. 3 indicates the Pin-Gain characteristics of the output stage amplifier 50 and respective sections, in addition to the APD 110. The APD 110 includes a linearizer (a linearizing circuit) 111 and a gate control circuit 112. The linearizer 111 includes a transistor (which is not illustrated in FIG. 3) having a gate terminal (a control terminal). The Pin-Gain characteristic of the APD 110 described with reference to FIG. 2 is the Pin-Gain characteristic of the linearizer 111 in FIG. 3.

The gate control circuit 112 includes a coupler 112A that detects the signal level of the RF signal input from the RF signal input terminal 101 and controls a gate voltage Vg of the gate terminal of the transistor of the linearizer 111 in accordance with the signal level of the RF signal detected by the coupler 112A. The coupler 112A is an example of a directional coupler.

In FIG. 3, the Pin-Vg characteristic of the input signal of the gate voltage Vg output by the gate control circuit 112 with respect to the power Pin is illustrated in the dashed line balloon. Additionally, the respective Pin-Gain characteristics are illustrated below the linearizer 111, the output stage amplifier 50, and the RF signal output terminal 102. In the Pin-Gain characteristics of the linearizer 111, the output stage amplifier 50, and the RF signal output terminal 102 illustrated in FIG. 3, the solid line indicates the gain obtained when the gate voltage of the transistor of the linearizer 111 is controlled by the gate voltage Vg output by the gate control circuit 112.

For comparison, the dashed line indicates the gain in the Pin-Gain characteristic of the linearizer 111 obtained when the transistor of the linearizer 111 performs only the class B operation. That is, the characteristic illustrated by the dashed line for comparison indicates the gain obtained when the gate voltage of the transistor of the linearizer 111 is not controlled by the gate control circuit 112 and the transistor of the linearizer 111 performs only the class B operation.

Additionally, in the Pin-Gain characteristic of the RF signal output terminal 102, the solid line indicates the gain given to the RF signal output from the signal output terminal 102 when the gate voltage Vg of the transistor of the linearizer 111 is controlled by the gate voltage Vg output by the gate control circuit 112. For comparison, in the Pin-Gain characteristic of the RF signal output terminal 102, the dashed line indicates the gain given to the RF signal output from the signal output terminal 102 obtained when the gate voltage Vg is not controlled by the gate control circuit 112 and the transistor of the linearizer 111 performs only the class B operation.

The gate control circuit 112 controls the gate voltage Vg in the regions (1), (2), and (3), as in the Pin-Vg characteristic illustrated in the dashed line balloon. The gate voltage Vg gradually increases in the region (1) as the power Pin of the input signal increases, increases more rapidly in the region (2) than in the region (1) as the power Pin of the input signal increases, and increases much more rapidly in the region (3) than in the region (2) as the power Pin of the input signal increases.

In the Pin-Gain characteristic of the linearizer 111 in which the gate voltage Vg is controlled by such a Pin-Vg characteristic, the gain in the region (1) is equal to the gain of the class B operation illustrated by the dashed line, but the gain in the regions (2) and (3) increases more than the gain of the class B operation, and the gain rapidly increases in a region in which the power Pin of the input signal is great, as in the case of the class C operation illustrated in FIG. 2. As described above, the gate control circuit 112 controls the gate voltage Vg to achieve the Pin-Gain characteristic illustrated by the solid line in FIG. 2 and illustrated by the solid line below the linearizer 111 in FIG. 3.

When the RF signal amplified with such a Pin-Gain characteristic of the linearizer 111 is input to the output stage amplifier 50, the input RF signal is affected by distortion of the Pin-Gain characteristic of the output stage amplifier 50. Thus, the Pin-Gain characteristic at the signal output terminal 102 obtained when the gate voltage Vg is not controlled by the gate control circuit 112 becomes a characteristic in which the gain rapidly decreases when the output Pin enters the region (2) as illustrated by the dashed line.

With respect to the above, in the Pin-Gain characteristic at the signal output terminal 102 in a case where the gate voltage Vg is controlled by the gate control circuit 112, a substantially constant gain is obtained when the power Pin enters in the region (2) as in the region (1), as illustrated by the solid line, and a substantially constant gain is obtained until the gain is saturated in a region in which the power Pin of the input signal is highest in the region (3). By using the APD 110 to compensate for the Pin-Gain characteristic of the output stage amplifier 50, the Pin-Gain characteristic representing a relation of the gain given to the RF signal output from the RF signal output terminal 102 with respect to the power Pin of the RF signal input to the RF signal input terminal 101 can be flattened.

Here, the reason why the transistor of the linearizer 111 of the APD 110 is caused to perform the class B operation, the transitional operation between the class B operation and the class AB operation, and the class AB operation without causing the transistor of the linearizer 111 of the APD 110 to perform the class C operation is to obtain a gain higher than the gain of the class C operation. As described, by obtaining a gain higher than the gain of the class C operation, the size of the amplifying device 100 is reduced. This will be described in detail below.

Configuration of the Amplifying Device 100

Figure 4:
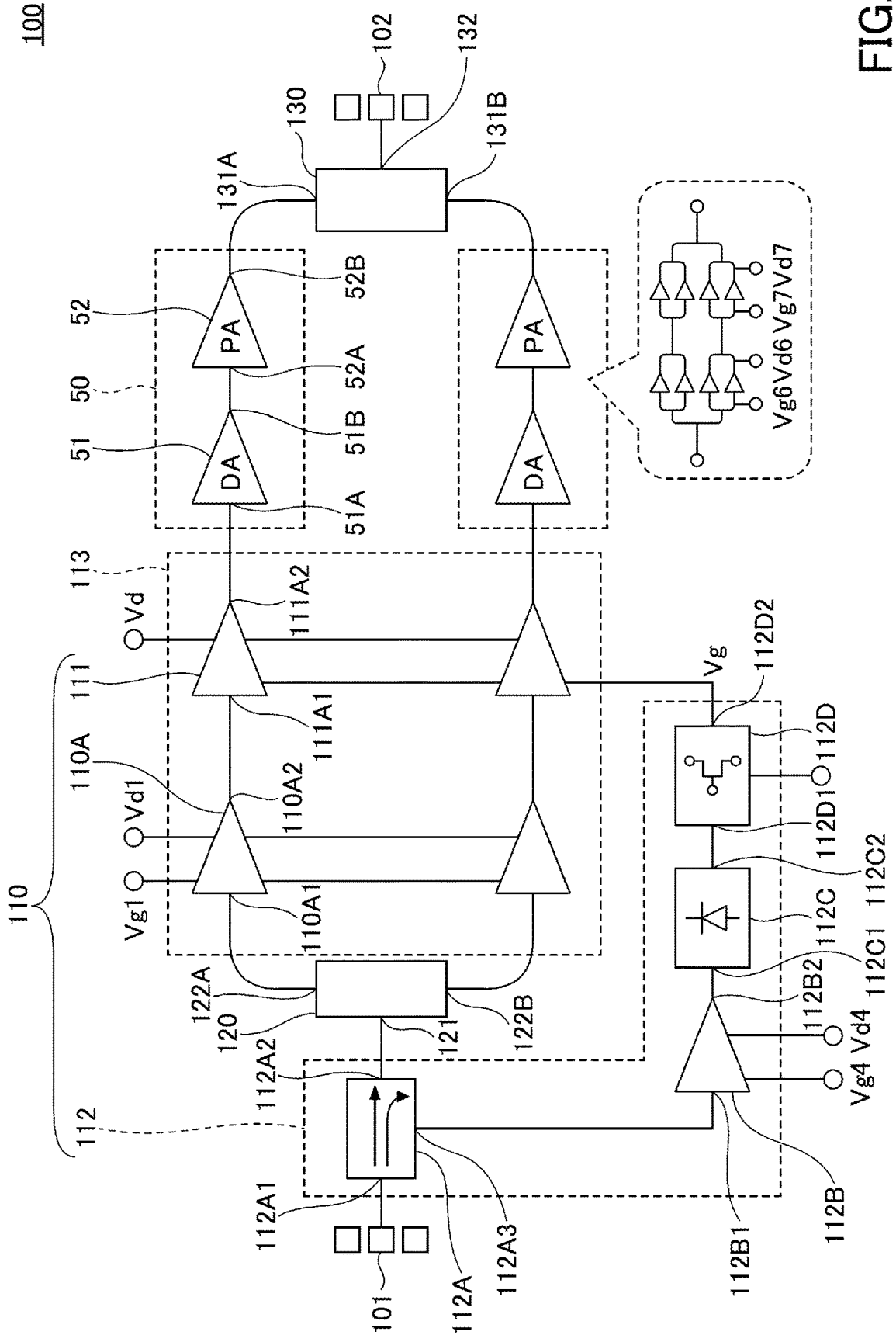
FIG. 4 is a diagram illustrating a configuration of the amplifying device 100.

FIG. 4 is a diagram illustrating a configuration of the amplifying device 100. The amplifying device 100 includes a distributor 120 and a coupler 130, in addition to the RF signal input terminal 101, the RF signal output terminal 102, the APD 110, and the output stage amplifier 50 illustrated in FIG. 1 and FIG. 3. Additionally, the APD 110 includes a buffer amplifier 110A in addition to the linearizer 111 and the gate control circuit 112. The buffer amplifier 110A is an example of a buffer circuit and is provided in a prior stage of the linearizer 111. The buffer amplifier 110A and the linearizer 111 constitute the linearization circuit 113.

In FIG. 4, the RF signal input terminal 101 and the RF signal output terminal 102 are each represented by three terminals. The three terminals represent ground-signal-ground (GSG) and many sections between the RF signal input terminal 101 and the RF signal output terminal 102 are connected by transmission lines to which a characteristic impedance is set, such as microstrip lines. The characteristic impedance is, for example, 50Ω.

In the amplifying device 100 illustrated in FIG. 4, the APD 110 includes two linearizers 111 and two buffer amplifiers 110A. Two linearizers 111 and two buffer amplifiers 110A are respectively connected in series. Additionally, the amplifying device 100 includes two output stage amplifiers 50. Each of the output stage amplifiers 50 includes a driver amplifier (DA) 51 and a power amplifier (PA) 52. The PA 52 is an example of a power amplifier. Within each of the output stage amplifiers 50, the DA 51 and the PA 52 are connected in series. In the amplifying device 100 illustrated in FIG. 4, two series circuits are connected in parallel between the distributor 120 and the coupler 130, and the buffer amplifier 110A, the linearizer 111, the DA 51, and the PA 52 are connected in series in each of the two series circuits. Between the distributor 120 and the coupler 130, two series circuits, in which the buffer amplifiers 110A, the linearizers 111, the DAs 51, and the PAs 52 are respectively connected in series, are connected in parallel, and thereby increasing the RF signal input to the RF signal input terminal 101. Here, although a configuration in which two series circuits are connected in parallel between the distributor 120 and the coupler 130 has been described, the number of series circuits connected in parallel to one another may be three or greater.

Configuration of the RF Signal Input Terminal 101 and the Coupler 112A

The coupler 112A of the gate control circuit 112 is connected to the RF signal input terminal 101. The coupler 112A is an example of a directional coupler and includes an input terminal 112A1 and output terminals 112A2 and 112A3. The output terminal 112A2 is an example of a first output terminal, and the output terminal 112A3 is an example of a second output terminal. The input terminal 112A1 is connected to the RF signal input terminal 101. The coupler 112A outputs, from the output terminal 112A2, the RF signal input from the RF signal input terminal 101 to the input terminal 112A1, and outputs, from the output terminal 112A3, a portion of the AC component of the RF signal input to the input terminal 112A1.

Configuration of the Distributor 120

The distributor 120 includes an input terminal 121 and output terminals 122A and 122B. The input terminal 121 is connected to the output terminal 112A2 of the coupler 112A. The output terminal 122A is connected to the input terminal 110A1 of the buffer amplifier 110A of the series circuit illustrated in FIG. 4 on the upper side, and the output terminal 122B is connected to the input terminal of the buffer amplifier 110A of the series circuit illustrated in FIG. 4 on the lower side. The distributor 120 equally divides, in two, the power of the RF signal input from the coupler 112A to the input terminal 121 to output the power from the output terminals 122A and 122B.

Configuration of the Buffer Amplifier 110A

The buffer amplifier 110A includes an input terminal 110A1 and an output terminal 110A2. The input terminal 110A1 of the buffer amplifier 110A of the series circuit illustrated in FIG. 4 on the upper side is connected to the output terminal 122A of the distributor 120, and the output terminal 110A2 is connected to an input terminal 111A1 of the linearizer 111 on the upper side. The input terminal 110A1 of the buffer amplifier 110A of the series circuit illustrated in FIG. 4 on the lower side is connected to the output terminal 122B of the distributor 120, and the output terminal 110A2 is connected to the input terminal 111A1 of the linearizer 111 on the lower side. The buffer amplifier 110A includes an FET, a gate voltage Vg1 is applied to a gate terminal of the FET, and a drain voltage Vd1 is applied to a drain terminal.

When the gate voltage Vg applied to the gate terminal of the transistor of the linearizer 111 changes and the operation of the transistor of the linearizer 111 changes from the class B operation to the class AB operation through the transitional state, the input impedance of the transistor of the linearizer 111 changes. Additionally, when the operation of the transistor of the linearizer 111 changes from the class AB operation to the class B operation through the transitional state, the input impedance of the transistor of the linearizer 111 changes.

The buffer amplifier 110A is provided so that if the input impedance of the transistor of the linearizer 111 changes, the output impedance of the buffer amplifier 110A that is seen from the input side of the linearizer 111 and the input impedance of the linearizer 111 that is seen from the output side of the buffer amplifier 110A are matched to a certain extent.

For example, it is assumed that the output impedance of the buffer amplifier 110A is matched with the input impedance of the linearizer 111 when the transistor of the linearizer 111 performs the class B operation. In this case, even when the transistor of the linearizer 111 performs the class AB operation, the output impedance of the buffer amplifier 110A and the input impedance of the linearizer 111 may be matched to a certain extent. The same is applicable when it is assumed that the output impedance of the buffer amplifier 110A is matched with the input impedance of the linearizer 111 when the transistor of the linearizer 111 performs the AB class operation.

Additionally, the output impedance of the buffer amplifier 110A may be matched with the input impedance of the linearizer 111 when the transistor of the linearizer 111 performs the operation between the class B operation and the class AB operation. In this case, the output impedance of the buffer amplifier 110A and the input impedance of the linearizer 111 are matched to a certain extent, when the transistor of the linearizer 111 performs either the class B operation or the class AB operation.

More specifically, the buffer amplifier 110A is provided so that the reflection loss of the RF signal input to the input terminal 111A1 of the linearizer 111 from the output terminal 110A2 of the buffer amplifier 110A falls in a range less than or equal to a predetermined value even when the input impedance of the transistor of the linearizer 111 changes. This is because if the reflection loss is high, the RF signal is not efficiently input from the buffer amplifier 110A to the linearizer 111, and the transmission efficiency of the RF signal is reduced. Here, the reflection loss is a ratio of the reflected power to the input power in the high frequency circuit to which the RF signal is input, and is expressed in decibels (dB).

For example, the predetermined value of the reflection loss may be set to −10 dB when the transistor of the linearizer 111 performs the class B operation. This causes the reflection loss to rise above −10 dB, for example, to be −7 dB or −5 dB when the transistor of the linearizer 111 performs the class AB operation or the operation between the class B operation and the class AB operation. As described, when the predetermined value of the reflection loss is set when the transistor of the linearizer 111 performs the class B operation, the reflection loss obtained when the transistor of the linearizer 111 performs the class AB operation or the operation between the class B and the class AB operation may be less than or equal to an upper limit level at which the amplifying device 100 can be applied to wireless communication in the E-band (i.e., less than or equal to the predetermined level), for example. The same is applicable when the predetermined value of the reflection loss is set when the transistor of the linearizer 111 performs the class AB operation. The output impedance of the buffer amplifier 110A is set such that the reflection loss is less than or equal to the predetermined level when the transistor of the linearizer 111 performs each of the operations, and thereby enabling the RF signal to be efficiently input from the buffer amplifier 110A to the linearizer 111 when the transistor of the linearizer 111 performs any one of the operations.

For example, the upper level at which the amplifying device 100 can be applied to the wireless communication in the E-band is −7 dB or −5 dB as described above, and may be set to a level that further reduces the reflection loss, such as −10 dB or −15 dB, depending on a usage condition of the wireless communication. This can obtain a good wireless communication environment in which the reflection loss in the E-band is low.

Additionally, the buffer amplifier 110A is provided to prevent, when the input impedance of the linearizer 111 changes, the influence of the change in the input impedance from reaching the distributor 120 that is a stage prior to the buffer amplifier 110A. The impedance between the distributor 120 and the buffer amplifier 110A is matched by a microstrip line or the like. Therefore, if the influence of the change in the input impedance of the linearizer 111 reaches the prior stage of the buffer amplifier 110A, the impedance matching between the distributor 120 and the buffer amplifier 110A is influenced and the transmission efficiency of the RF signal is reduced. The buffer amplifier 110A is provided so that such a change in the input impedance of the linearizer 111 does not reach a stage prior to the buffer amplifier 110A. The buffer amplifier 110A includes an FET. The FET provides high isolation (separation) between the input and output. By utilizing such high isolation of the FET of the buffer amplifier 110A, a configuration in which the change in the input impedance of the linearizer 111 does not reach a stage prior to the buffer amplifier 110A can be achieved.

Configuration of the Linearizer 111

The linearizer 111 includes the input terminal 111A1 and an output terminal 111A2. The input terminal 111A1 is connected to the output terminal 110A2 of the buffer amplifier 110A, and the output terminal 111A2 is connected to an input terminal 51A of the DA 51. The transistor of the linearizer 111 is implemented by the FET, the gate voltage Vg is applied to the gate terminal of the FET from the gate control circuit 112, and a drain voltage Vd is applied to the drain terminal. The FET of the linearizer 111 performs the class B operation, the class AB operation, or the operation in the transitional state between the class B operation and the class AB operation in response to the gate voltage Vg from the gate control circuit 112 that is changed in accordance with the level of the RF signal. This change in the operations of the FET of the linearizer 111 causes the input impedance of the linearizer 111 to change.

Configuration of the DA 51

The DA 51 includes the input terminal 51A and an output terminal 51B. The input terminal 51A is connected to the output terminal 111A2 of the linearizer 111, and the output terminal 51B is connected to an input terminal 52A of the PA 52. The DA 51 has a configuration in which multiple amplifiers each including multiple FETs are connected in parallel, as illustrated in the balloon below the DA 51 on the lower side. The gate voltage Vg6 is applied to the gate terminal of the FET of the DA 51, and the drain voltage Vd6 is applied to the drain terminal. The amplification factor of the DA 51 is lower than the amplification factor of the PA 52 and is a medium output power amplifier with respect to the PA 52 that is a high output power amplifier. The DA 51 is provided as a driver amplifier of the PA 52.

Configuration of the PA 52

The PA 52 includes the input terminal 52A and an output terminal 52B. The input terminal 52A is connected to the output terminal 51B of the DA 51. The output terminal 52B of the PA 52 illustrated in FIG. 4 on the upper side is connected to an input terminal 131A of the coupler 130, and the output terminal 52B of the PA 52 illustrated in FIG. 4 on the lower side is connected to an input terminal 131B of the coupler 130. The PA 52 has a configuration in which multiple amplifiers each including multiple FETs are connected in parallel, as illustrated in the balloon below the PA 52 on the lower side. The multiple amplifiers of the PA 52 are respectively connected in series to the multiple amplifiers of the DA 51, and the amplifiers of the DA 51 and the PA 52 that are connected in series are connected in parallel with each other. The gate voltage Vg7 is applied to the gate terminal of the FET of the PA 52, and a drain voltage Vd7 is applied to the drain terminal. The amplification factor of the PA 52 is higher than the amplification factor of the DA 51 and the PA 52 is a high power amplifier.

Configurations of the Coupler 130

The coupler 130 includes the input terminals 131A and 131B and an output terminal 132. The input terminal 131A is connected to the output terminal 52B of the PA 52 of the series circuit illustrated in FIG. 4 on the upper side, and the input terminal 131B is connected to the output terminal 52B of the PA 52 of the series circuit illustrated in FIG. 4 on the lower side. The output terminal 132 is connected to the RF signal output terminal 102. The coupler 130 combines the RF signals input from the two PAs 52 to the two input terminals 131A and 131B to output the combined RF signal from the output terminal 132.

Configuration of the Gate Control Circuit 112

The gate control circuit 112 includes the coupler 112A, an amplifier 112B, a rectifier 112C, and a level shifter 112D. Among these, the coupler 112A has been already described, and thus the amplifier 112B, the rectifier 112C, and the level shifter 112D will be described here.

The amplifier 112B includes an input terminal 112B1 and an output terminal 112B2. The input terminal 112B1 is connected to the output terminal 112A3 of the coupler 112A, and the output terminal 112B2 is connected to an input terminal 112C1 of the rectifier 112C. The amplifier 112B includes an FET. The FET of the amplifier 112B is an example of a fourth FET. The gate voltage Vg4 is applied to the gate terminal of the FET and the drain voltage Vd4 is applied to the drain terminal. The gate voltage Vg4 and the drain voltage Vd4 are fixed voltages. The amplifier 112B amplifies the AC component of the RF signal input from the coupler 112A with a predetermined gain to output the amplified AC component to the rectifier 112C.

The rectifier 112C includes an input terminal 112C1 and an output terminal 112C2. The output terminal 112C2 is connected to an input terminal 112D1 of the level shifter 112D. The rectifier 112C outputs, to the level shifter 112D, a DC component obtained by rectifying the AC component amplified by the amplifier 112B.

The level shifter 112D includes the input terminal 112D1 and an output terminal 112D2. The output terminal 112D2 is connected to the gate terminal of the FET of the linearizer 111 and outputs the gate voltage Vg. The level shifter 112D outputs the gate voltage Vg in accordance with the DC component input from the rectifier 112C. The gate voltage Vg output by the level shifter 112D is a voltage that causes the FET of the linearizer 111 to perform the class B operation when the signal level of the RF signal is a level of the region (1) in the Pin-Gain characteristic of the linearizer 111 of FIG. 3. Additionally, the gate voltage Vg output by the level shifter 112D is a voltage that causes the FET of the linearizer 111 to perform the operation between the class B operation and the class AB operation when the signal level of the RF signal is a level of the region (2) in the Pin-Gain characteristic of the linearizer 111 of FIG. 3. Further, the gate voltage Vg output by the level shifter 112D is a voltage that causes the FET of the linearizer 111 to perform the class AB operation when the signal level of the RF signal is a level of the region (3) in the Pin-Gain characteristic of the linearizer 111 of FIG. 3.

Equivalent Circuit of the Gate Control Circuit 112

Figure 5:
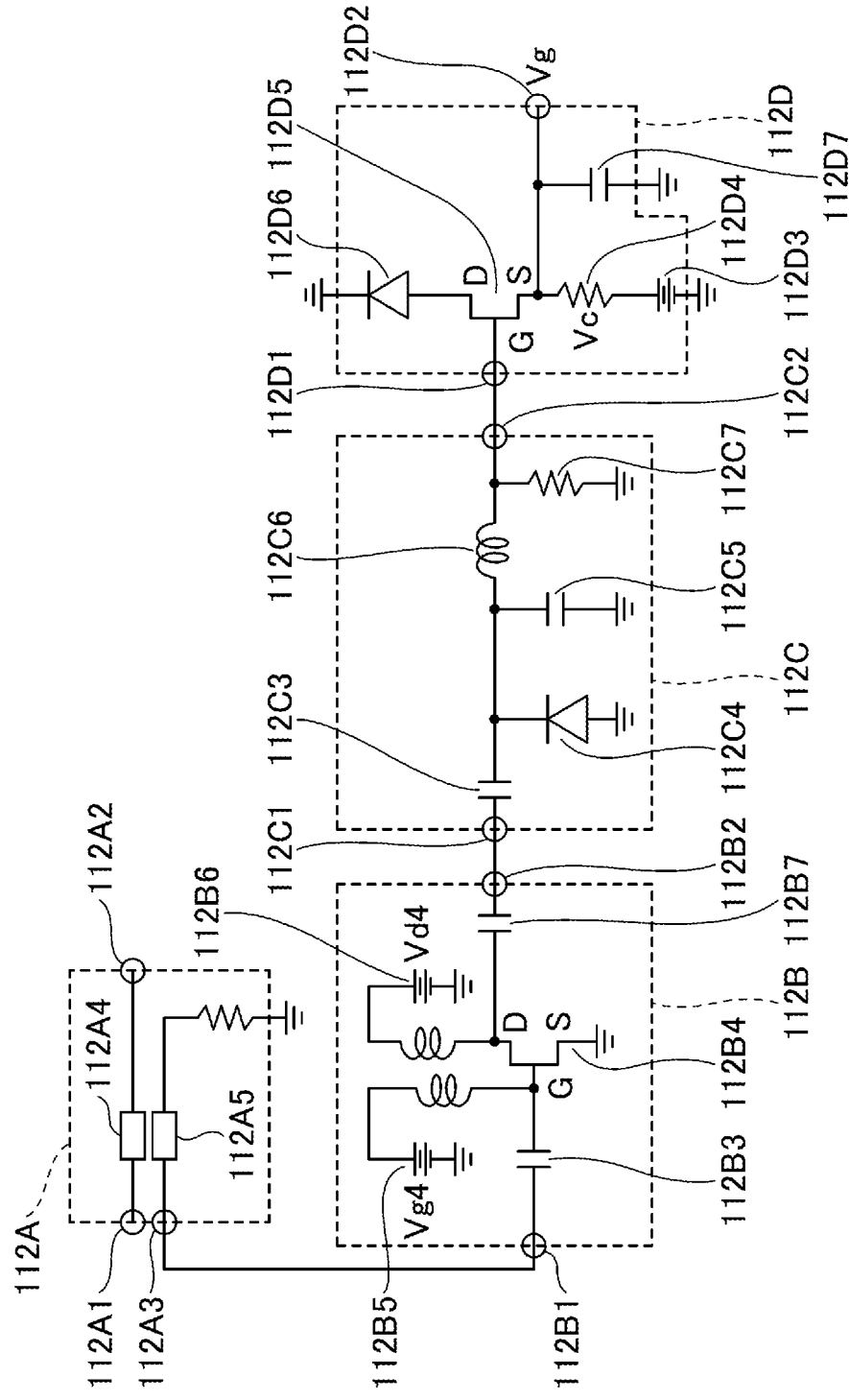
FIG. 5 is a diagram illustrating an equivalent circuit of a gate control circuit 112.

FIG. 5 is a diagram illustrating an equivalent circuit of the gate control circuit 112. Here, equivalent circuits of the coupler 112A, the amplifier 112B, the rectifier 112C, and the level shifter 112D will be described.

The coupler 112A includes two transmission lines 112A4 and 112A5 in addition to the input terminal 112A1 and the output terminals 112A2 and 112A3. The transmission lines 112A4 and 112A5 are, for example, formed by microstrip lines. The transmission line 112A4 connects the input terminal 112A1 to the output terminal 112A2, and the transmission line 112A5 connects the output terminal 112A3 to a resistor connected to ground. The transmission lines 112A4 and 112A5 extend parallel in close proximity and are capacitively coupled. When the RF signal is input from the input terminal 112A1 to the transmission line 112A4, the RF signal is output from the output terminal 112A2, and a signal representing the AC component of the RF signal is generated in the transmission line 112A5. The signal representing the AC component of the RF signal generated in the transmission line 112A5 is output from the output terminal 112A3.

The amplifier 112B includes a capacitor 112B3, an FET 112B4, DC power supplies 112B5 and 112B6, and a capacitor 112B7 in addition to the input terminal 112B1 and the output terminal 112B2. The FET 112B4 is an example of the fourth FET, the gate terminal of the FET 112B4 is an example of a fourth gate terminal, and the drain terminal of the FET 112B4 is an example of a fourth drain terminal. The capacitor 112B3 is connected in series between the input terminal 112B1 and the gate terminal of the FET 112B4 and blocks the DC component of the signal input to the input terminal 112B1.

The FET 112B4 includes a gate terminal (G) connected to capacitor 112B3, a drain terminal (D) connected to capacitor 112B7, and a source terminal (S) connected to ground. The DC power supply 112B5 that outputs the gate voltage Vg4 is connected to the gate terminal, and the DC power supply 112B6 that outputs the drain voltage Vd4 is connected to the drain terminal, and the FET 112B4 is turned on. Thus, the FET 112B4 can amplify the AC component of the RF signal input to the gate terminal and output the RF signal from the drain terminal to the rectifier 112C through the capacitor 112B7. The capacitor 112B7 is connected in series between the drain terminal and the output terminal 112B2 to block the DC component of the signal amplified by the FET 112B4. The FET 112B4 can amplify the AC component corresponding to the signal level of the RF signal and output the amplified AC component to the rectifier 112C, and thereby causing the transistor of the linearizer 111 to perform the class B operation or the class AB operation in accordance with the signal level of the RF signal with certainty.

The rectifier 112C includes a capacitor 112C3, a diode 112C4, a capacitor 112C5, a coil 112C6, and a resistor 112C7, in addition to the input terminal 112C1 and the output terminal 112C2. The capacitor 112C5 is an example of a smoothing element. The capacitor 112C3 is connected in series between the input terminal 112C1 and a cathode of the diode 112C4 to block the DC component of the signal input to the input terminal 112C1.

The diode 112C4 is an example of a rectifying element. In the diode 112C4, an anode is connected to ground and a cathode is connected to the capacitor 112C3, one electrode of the capacitor 112C5 (the upper side in FIG. 5), and the coil 112C6. The line connecting the capacitor 112C3 and the capacitor 112C5 is branched and the diode 112C4 is connected between a point of the branch and ground. A threshold value of the diode 112C4 is set to the amplitude of the AC component observed when the level of the RF signal input to the RF signal input terminal 101 is in the region (1) illustrated in FIG. 3.

Thus, the diode 112C4 is turned off when the level of the RF signal input to the RF signal input terminal 101 is a signal level of the region (1) illustrated in FIG. 3, and turned on when the level of the RF signal input to the RF signal input terminal 101 is a signal level of the region (2) illustrated in FIG. 3. The diode 112C4 rectifies and outputs the AC component input through the capacitor 112C3 when the level of the RF signal input to the RF signal input terminal 101 is a signal level of the region (2) or (3) illustrated in FIG. 3. The diode 112C4 performs half-wave rectification. Here, the direction of the diode 112C4 that performs half-wave rectification may be reversed. That is, the anode of the diode 112C4 may be connected to the capacitor 112C3, the capacitor 112C5, and the coil 112C6, and the cathode may be connected to ground. Alternatively, four diodes may be connected in a bridge configuration instead of the diode 112C4 to perform full-wave rectification.

The capacitor 112C5 is a smoothing capacitor that smooths a signal produced by the half-wave rectification performed by the diode 112C4. The coil 112C6 is connected in series between one electrode of the capacitor 112C5 (the upper electrode in FIG. 5) and the output terminal 112C2, blocks the AC component of the voltage smoothed by the capacitor 112C5, and outputs only the DC component. The connection line is branched between the coil 112C6 and the output terminal 112C2, the resistor 112C7 is connected between a point of the branch and ground, and is provided to generate a DC voltage ΔVdc at the output terminal 112C2 when the diode 112C4 is turned on and the AC component is rectified.

The DC voltage ΔVdc of the output terminal 112C2 of the rectifier 112C is approximately zero when the level of the RF signal input to the RF signal input terminal 101 is the signal level of the region (1) illustrated in FIG. 3, and increases when the level of the RF signal input to the RF signal input terminal 101 is the signal level of the region (2) or (3) illustrated in FIG. 3, as the voltage value of the AC component rectified by the diode 112C4 increases. The DC voltage ΔVdc is a voltage that turns off an FET 112D5 of the level shifter 112D including the gate terminal connected to the output terminal 112C2 when the level of the RF signal input to the RF signal input terminal 101 is the signal level of the region (1) illustrated in FIG. 3. Additionally, the DC voltage ΔVdc is a voltage that turns on the FET 112D5 of the level shifter 112D when the level of the RF signal input to the RF signal input terminal 101 is the signal level of the region (2) or (3) illustrated in FIG. 3.

The rectifier 112C can output, to the level shifter 112D, a DC voltage that reflects the amplified AC component input from the drain terminal of the FET 112B4 and cause the transistor of the linearizer 111 to perform the class B or class AB operation in accordance with the signal level of the RF signal with certainty. Additionally, the diode 112C4 can change the level of the DC voltage output to the level shifter 112D between when the level of the RF signal is the signal level of the region (1) illustrated in FIG. 3 and when the level of the RF signal is the signal level of the region (2) or (3) with certainty, and can cause the transistor of the linearizer 111 to perform the class B operation or the class AB operation with certainty in accordance with the signal level of the RF signal.

The level shifter 112D includes, a DC power supply 112D3, a resistor 112D4, the FET 112D5, a diode 112D6, and a capacitor 112D7, in addition to the input terminal 112D1 and the output terminal 112D2. The FET 112D5 is an example of a fifth FET, and the gate terminal of the FET 112D5 is an example of a fifth gate terminal.

The DC power supply 112D3 outputs a voltage Vc. The DC power supply 112D3 is connected to the source terminal of the FET 112D5 through the resistor 112D4, and the DC power supply 112D3 and the resistor 112D4 are connected in series between the output terminal 112D2 and ground. When the FET 112D5 is off, the gate voltage Vg output by the level shifter 112D from the output terminal 112D2 becomes the voltage Vc. The voltage Vc is a voltage that causes the FET of the linearizer 111 to perform the class B operation in the region (1).

The FET 112D5 includes a gate terminal connected to the input terminal 112D1, a source terminal connected to the resistor 112D4 and the output terminal 112D2, and a drain terminal connected to the anode of the diode 112D6. The FET 112D5 is turned off when the level of the RF signal input to the RF signal input terminal 101 is the signal level of the region (1) illustrated in FIG. 3, and turned on when the level of the RF signal input to the RF signal input terminal 101 is the signal level of the region (2) or (3) illustrated in FIG. 3.

The diode 112D6 includes the anode connected to the drain terminal of the FET 112D5 and the cathode connected to ground. The line between a point connecting the source terminal of the FET 112D5 to the resistor 112D4 and the output terminal 112D2 is branched, and the capacitor 112D7 is connected between a point of the branch and ground.

Because the FET 112D5 is turned off when the level of the RF signal input to the RF signal input terminal 101 is the signal level of the region (1) illustrated in FIG. 3, the gate voltage Vg output by the level shifter 112D becomes the voltage Vc. The gate voltage Vg being the voltage Vc is an example of the gate voltage Vg being a first gate voltage. Therefore, the FET of the linearizer 111 performs the class B operation.

When the level of the RF signal input to the RF signal input terminal 101 is the signal level of the region (2) or (3) illustrated in FIG. 3, the FET 112D5 is turned on. Here, when the voltage of the source terminal to the gate terminal of the FET 112D5 is Vgs, the gate voltage Vg of the output terminal 112D2 becomes Vg=Vc−Vgs+ΔVdc because the current flows from the source terminal to the drain terminal when the FET 112D5 is on. The gate voltage Vg=Vc−Vgs+ΔVdc is an example of the gate voltage Vg being the second gate voltage.

Because the DC voltage ΔVdc output from the output terminal 112C2 increases as the voltage value of the AC component rectified by the diode 112C4 increases when the level of the RF signal input to the RF signal input terminal 101 is the signal level of the region (2) or (3) illustrated in FIG. 3, the gate voltage Vg of the output terminal 112D2 increases as the voltage value of the AC component rectified by the diode 112C4 increases. Thus, when the RF signal is at the signal level of the region (1), the voltage Vc can be output from the source terminal, and when the RF signal is at the signal level of the region (2) or (3), Vg=Vc−Vgs+ΔVdc that is higher than the voltage Vc can be output from the source terminal. Therefore, when the level of the RF signal is the signal level of the region (1), the transistor of the linearizer 111 can be caused to perform the class B operation with certainty, and when the level of the RF signal is the signal level of the region (2) or (3), the transistor of the linearizer 111 can be caused to perform the class AB operation with certainty. Using the gate control circuit 112 as described above can compensate for distortion of the input/output characteristics of the output stage amplifier 50 with certainty.

Equivalent Circuit of the Buffer Amplifier 110A and the Linearizer 111

Figure 6:
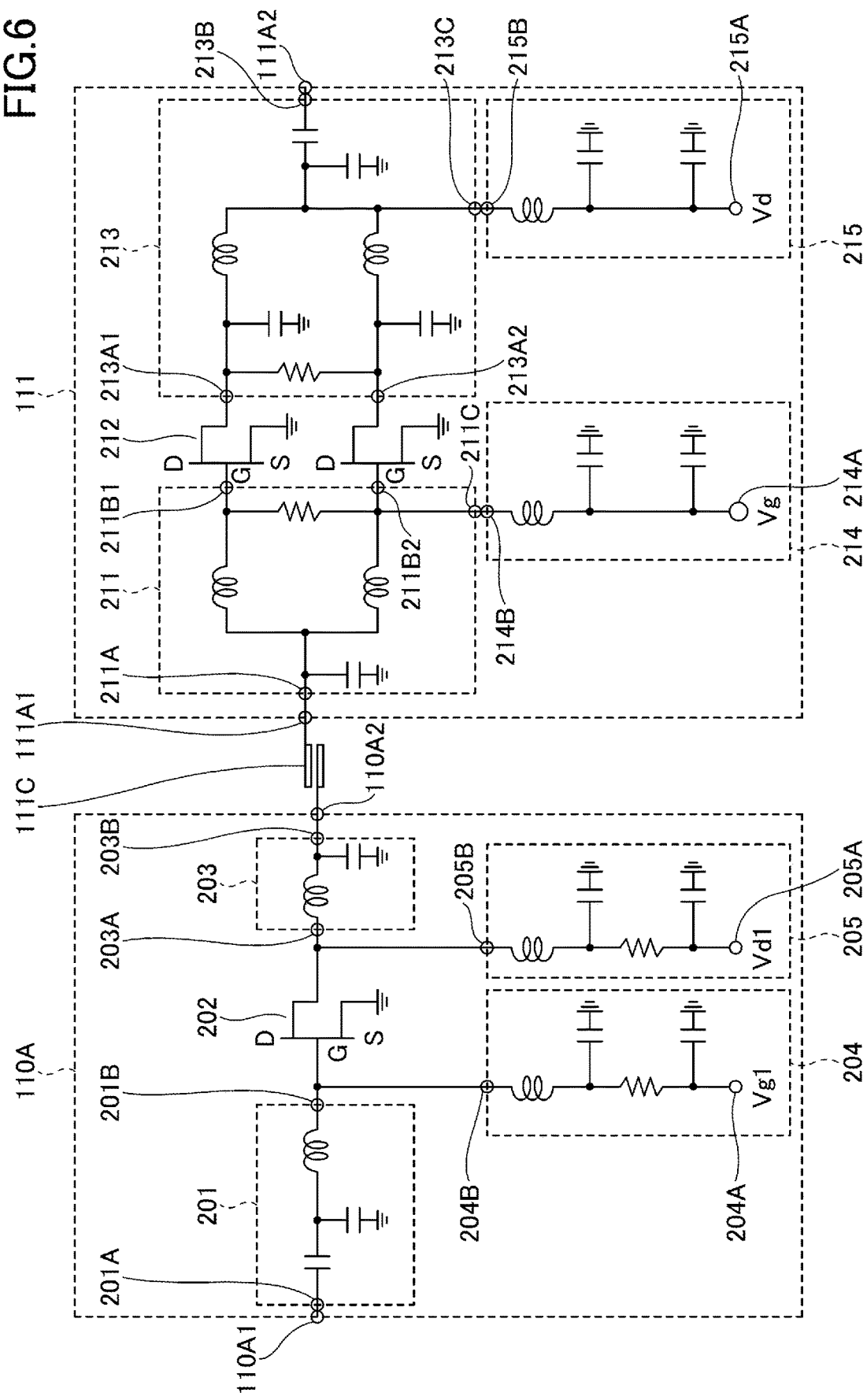
FIG. 6 is a diagram illustrating an equivalent circuit of a buffer amplifier 110A and a linearizer 111.

FIG. 6 illustrates an equivalent circuit of the buffer amplifier 110A and the linearizer 111. The buffer amplifier 110A includes a matching circuit 201, an FET 202, a matching circuit 203, and matching circuits 204 and 205, in addition to the input terminal 110A1 and the output terminal 110A2. The FET 202 is an example of the first FET. The gate terminal of the FET 202 is an example of the first gate terminal, and the drain terminal of the FET 202 is an example of the first drain terminal.

The matching circuit 201 is provided between the input terminal 110A1 and the gate terminal of the FET 202 and includes an input terminal 201A and an output terminal 201B. The input terminal 201A is connected to the input terminal 110A1, and the output terminal 201B is connected to the gate terminal of the FET 202 and an output terminal 204B of the matching circuit 204. The matching circuit 201 includes, for example, two capacitors and one coil. The matching circuit 201 is provided to match impedance between the distributor 120 and the buffer amplifier 110A.

The matching circuit 203 is provided between a drain terminal of the FET 202 and the output terminal 110A2 and includes an input terminal 203A and an output terminal 203B. The input terminal 203A is connected to the drain terminal of the FET 202 and the output terminal 205B of the matching circuit 205, and the output terminal 203B is connected to the output terminal 110A2. The matching circuit 203 includes, for example, one coil and one capacitor. The matching circuit 203 is provided to match impedance with the linearizer 111 connected through a coupler 111C. Additionally, the input impedance of the linearizer 111 is changed when the operational state of the FET of the linearizer 111 becomes a state of the class B operation or the class AB operation. Thus, in the matching circuit 203, a capacitance of the capacitor and an inductance of the coil are configured such that the reflection loss of the RF signal input from the output terminal 110A2 to the input terminal 111A1 of the linearizer 111 falls below a predetermined value even when the operational state of the FET of the linearizer 111 changes.

The matching circuit 204 includes a power terminal 204A and the output terminal 204B. The power terminal 204A is connected to a DC power supply that outputs a DC voltage Vg1. Between the power terminal 204A and the output terminal 204B of the matching circuit 204, for example, two capacitors, one coil, and one resistor are provided to match impedance between the gate terminal of the FET 202 and the power terminal 204A. The output terminal 204B is connected to the gate terminal of the FET 202 and the output terminal 201B of the matching circuit 201. The matching circuit 204 outputs the gate voltage Vg1 to the gate terminal of the FET 202. The gate voltage Vg1 is a fixed DC voltage.

The matching circuit 205 includes a power terminal 205A and an output terminal 205B. The power terminal 205A is connected to a DC power supply that outputs a DC voltage Vd1. Between the power terminal 205A and the output terminal 205B of the matching circuit 205, for example, two capacitors, one coil, and one resistor are provided to match impedance between the drain terminal of the FET 202 and the power terminal 205A. The output terminal 205B is connected to the drain terminal of the FET 202 and the input terminal 203A of the matching circuit 203. The matching circuit 205 outputs the drain voltage Vd1 to the drain terminal of the FET 202. The drain voltage Vd1 is a fixed DC voltage.

The FET 202 includes the gate terminal connected to the output terminal 201B of the matching circuit 201 and the output terminal 204B of the matching circuit 204, the drain terminal connected to the input terminal 203A of the matching circuit 203 and the output terminal 205B of the matching circuit 205, and a source terminal connected to ground. The FET 202 is turned on in response to the gate voltage Vg1 being applied to the gate terminal and the drain voltage Vd1 being applied to the drain terminal, and amplifies a signal to be input to the gate terminal through the matching circuit 201 and outputs the amplified signal.

In the buffer amplifier 110A, the matching circuit 201 matches the impedance with the distributor 120 and the matching circuit 203 matches the output impedance of the buffer amplifier 110A with the input impedance of the linearizer 111. Additionally, the FET 202 provides high isolation between the input side and the output side, so that the influence of the change in the input impedance of the linearizer 111 does not reach a stage prior to the buffer amplifier 110A.

The buffer amplifier 110A and the linearizer 111 described above are alternately connected by the coupler 111C. The coupler 111C includes two transmission lines that are capacitively coupled. The two transmission lines are, for example, formed by microstrip lines, one transmission line is connected to the output terminal 110A2 of the buffer amplifier 110A, and the other transmission line is connected to the input terminal 111A1 of the linearizer 111.

The linearizer 111 includes a matching circuit 211, two FETs 212, a matching circuit 213, and matching circuits 214 and 215, in addition to the input terminal 111A1 and the output terminal 111A2. The two FETs 212 are examples of transistors of the linearizer 111, and the gate terminals of the two FETs 212 are examples of control terminals of the transistors of the linearizer 111.

One of the two FETs 212 is an example of the second FET and the other is an example of the third FET. The gate and drain terminal of the FET 212 that is an example of the second FET among the two FETs 212 are respectively an example of the second gate terminal and an example of the second drain terminal. The gate and drain terminals of the FET 212 that is an example of the third FET among the two FETs 212 are respectively an example of the third gate terminal and an example of the third drain terminal.

The matching circuit 211 is provided between the input terminal 111A1 and the gate terminals of the two FETs 212 and includes an input terminal 211A, output terminals 211B1 and 211B2, and a connection terminal 211C. The input terminal 211A is connected to the input terminal 111A1, and the output terminals 211B1 and 211B2 are respectively connected to the gate terminals of the two FETs 212. The connection terminal 211C is connected to an output terminal 214B of the matching circuit 214. The matching circuit 211 includes, for example, one capacitor, two coils, and one resistor. The matching circuit 211 is provided to match impedance between the buffer amplifier 110A and the linearizer 111, and more specifically is provided to achieve the input impedance of the linearizer 111 that matches the output impedance of the buffer amplifier 110A. The resistor of the matching circuit 211 is connected between the gate terminals of the two FETs 212 and is connected to the connection terminals 211C. Connecting the resistor of the matching circuit 211 between the gate terminals of the two FETs 212 is to improve isolation between the gate terminals of the two FETs 212. The gate voltage Vg is input to the connection terminal 211C from the gate control circuit 112 through the matching circuit 214. If the isolation between the gate terminals of the two FETs 212 is obtained without connecting the resistor of the matching circuit 211, the resistor of the matching circuit 211 may not be provided.

The matching circuit 213 is provided between the drain terminals of the two FETs 212 and the output terminal 111A2 and includes input terminals 213A1 and 213A2, an output terminal 213B, and a connection terminal 213C. The input terminals 213A1 and 213A2 are respectively connected to the drain terminals of the two FETs 212. The output terminal 213B is connected to the output terminal 111A2. The connection terminal 213C is connected to the output terminal 215B of the matching circuit 215. The matching circuit 213 includes, for example, two coils, four capacitors, and one resistor. The matching circuit 213 is provided to match impedance between the linearizer 111 and the output stage amplifier 50. Additionally, the output impedance of the linearizer 111 that is seen from the output stage amplifier 50 changes when the operational state of the FET of the linearizer 111 becomes a state of the class B operation or the class AB operation. Thus, in the matching circuit 213, a capacitance of the capacitor and an inductance of the coil are configured such that the reflection loss of the RF signal input from the output terminal 111A2 to the output stage amplifier 50 falls below a predetermined value even when the operational state of the FET of the linearizer 111 changes.

The matching circuit 214 includes a power terminal 214A and an output terminal 214B. The power terminal 214A is connected to the output terminal 112D2 (see FIG. 4 and FIG. 5) of the level shifter 112D of the gate control circuit 112 that outputs the DC voltage Vg. Between the power terminal 214A and the output terminal 214B of the matching circuit 214, a matching circuit that includes two capacitors and one coil, for example, is provided to match impedance between the gate terminals of the two FETs 212 and the power terminal 214A. The output terminal 214B is connected to the gate terminals of the two FETs 212 through the connection terminal 211C and the output terminals 211B1 and 211B2 of the matching circuit 211. The matching circuit 214 outputs the gate voltage Vg to the gate terminals of the two FETs 212.

The matching circuit 215 includes a power terminal 215A and an output terminal 215B. The power terminal 215A is connected to a DC power supply that outputs the DC voltage Vd. Between the power terminal 215A and the output terminal 215B of the matching circuit 215, a matching circuit that includes, for example, two capacitors and one coil is provided to match impedance between the drain terminals of the two FETs 212 and the power terminal 215A. The output terminal 215B is connected to the drain terminals of the two FETs 212 through two coils of the matching circuit 213. The matching circuit 215 outputs the drain voltage Vd to the drain terminals of the two FETs 212. The drain voltage Vd is a fixed DC voltage.

The two FETs 212 include the gate terminals connected to the output terminals 211B1 and 211B2 of the matching circuit 211, the drain terminals connected to the input terminals 213A1 and 213A2 of the matching circuit 213, and source terminals connected to ground. Portions between the gate and drain terminals of the two FETs 212 are connected in parallel between the input terminal 111A1 and the output terminal 111A2 of the linearizer 111. Inside the linearizer 111, the two FETs 212 are connected to the input terminal 111A1 through the matching circuit 211. Thus, the two FETs 212 are provided in the input section of the linearizer 111. The two FETs 212 are turned on in response to the gate voltage Vg being applied to the gate terminal and the drain voltage Vd being applied to the drain terminal, and amplify the signal input to the gate terminal through the matching circuit 211 and output the amplified signal.

The two FETs 212 perform the class B operation, the operation between the class B operation and the class AB operation, and the class AB operation in accordance with the gate voltage Vg. This can achieve the Pin-Gain characteristic of the linearizer 111 illustrated in FIG. 3 by the solid line. Additionally, by connecting the gate terminal and the drain terminal of the two FETs 212 in parallel, a greater gain can be more stably provided with respect to the RF signal input to the input terminal 111A1, and thereby output the RF signal having a greater power.

Operation of the Amplifying Device 100

As illustrated in FIG. 4, the RF signal input to the RF signal input terminal 101 passes through the coupler 112A of the gate control circuit 112, is distributed by the distributor 120, is amplified by the buffer amplifier 110A, is further amplified by the linearizer 111 with the Pin-Gain characteristic obtained by reversely distorting the Pin-Gain characteristic of the output stage amplifier 50 in the vertical axis representing the gain with respect to the horizontal axis representing the power Pin of the input signal, and is input to the output stage amplifier 50. In the output stage amplifier 50, the RF signal is amplified by the DA 51 and the PA 52. At this time, because the RF signal distorted with the Pin-Gain characteristic of the linearizer 111 is distorted with the Pin-Gain characteristic of the DA 51 and the PA 52, the Pin-Gain characteristic representing the relationship of the gain of the RF signal output from the RF signal output terminal 102 with respect to the power Pin of the RF signal input to the DA 51 is a characteristic in which a substantially constant gain is obtained over a range from a low level to a high level of the power Pin of the input signal. That is, the difference between the saturated output power Psat of the output stage amplifier 50 and the 1 dB gain compression point P1 dB can be reduced. Additionally, when the value of the 1 dB gain compression point P1 dB increases, the value of OIP3 becomes appropriate.

As described above, by providing the buffer amplifier 110A, the output impedance of the buffer amplifier 110A and the input impedance of the linearizer 111 can be matched at a certain extent even when the input impedance of the linearizer 111 changes, and the reflection loss between the buffer amplifier 110A and the linearizer 111 can be reduced.

Because of low reflection loss, the RF signal is efficiently input from the buffer amplifier 110A to the linearizer 111 under a low loss condition, and the RF signal input to the linearizer 111 is amplified in accordance with the reversed characteristic of the Pin-Gain characteristic of the PA 52 and then amplified by the PA 52, so that the Pin-Gain characteristic representing the relationship of the gain given to the RF signal output from the RF signal output terminal 102 with respect to the power Pin of the RF signal input to the RF signal input terminal 101 can be flattened. The gain obtained by the linearizer 111 to the RF signal is caused by the class B operation or the class AB operation, and is greater than the gain obtained by the class C operation. Thus, the Pin-Gain characteristic is flattened in the amplifying device 100, and the amplifying device 100 can output the RF signal that is amplified with a great gain without using additional amplifier.

Therefore, the size of the amplifying device 100 can be reduced by causing the reflection loss of the RF signal input from the buffer amplifier 110A to the linearizer 111 to fall below a predetermined value.

Additionally, the input impedance of the linearizer 111 is determined to be a certain value by the transistor of the linearizer 111 performing the class B operation, the operation between the class B operation and the class AB operation, or the class AB operation. Therefore, adjusting the output impedance of the buffer amplifier 110A to match the input impedance of the linearizer 111 can cause the reflection loss of the RF signal input from the buffer amplifier 110A to the linearizer 111 to fall below a predetermined value. That is, the reflection loss of the RF signal input from the buffer amplifier 110A to the linearizer 111 is determined at least by a setting value of the output impedance of the buffer amplifier 110A.

Amplifying Device 100M of a Modified Example of the Embodiment

As illustrated in FIG. 4, the embodiment in which two series circuits of the buffer amplifiers 110A, the linearizers 111, the DAs 51, and the PAs 52 are connected in parallel between the distributor 120 and the coupler 130 has been described above. However, one series circuit may be used.

Figure 7:
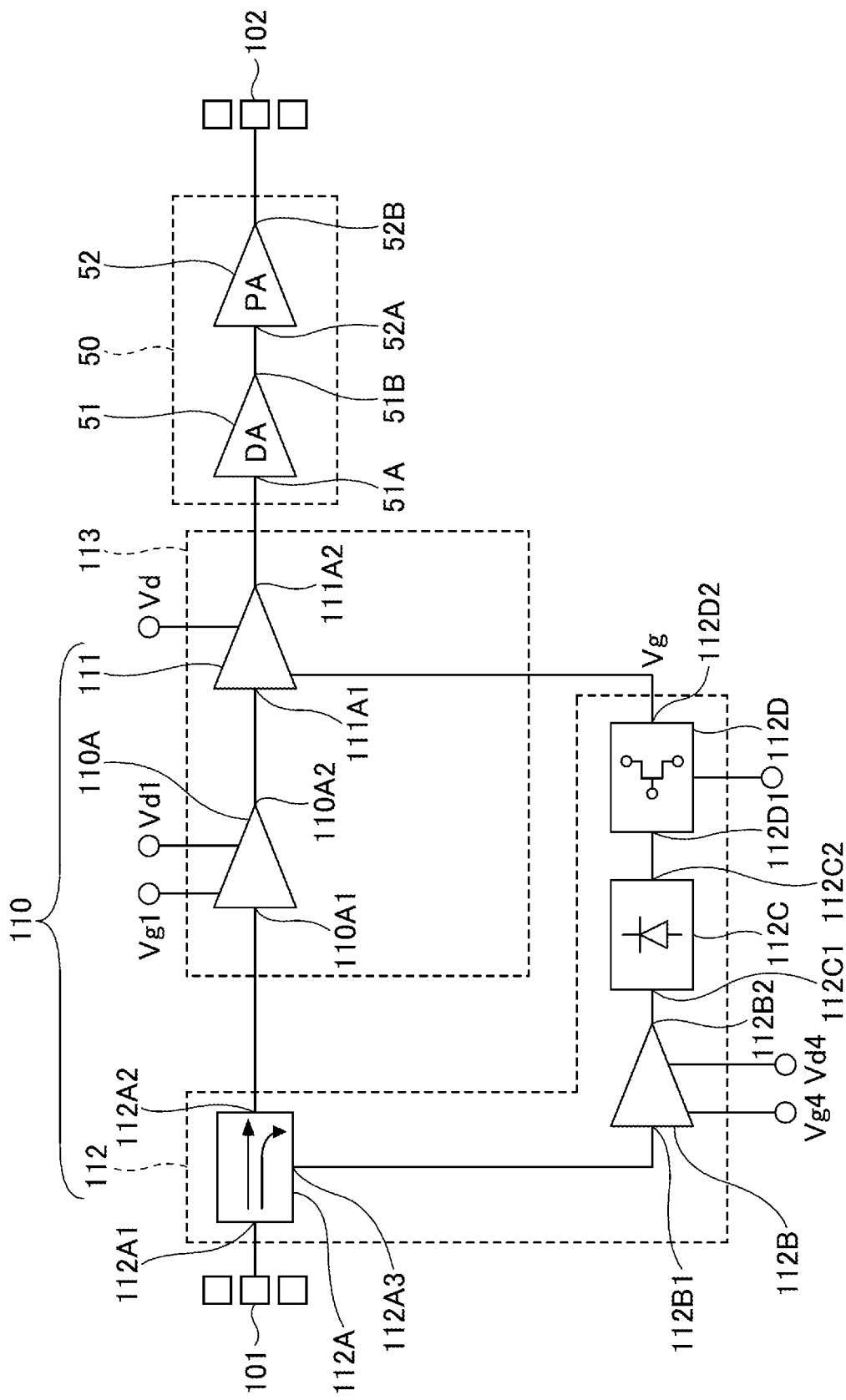
FIG. 7 is a diagram illustrating an amplifying device 100M of a modified example of the embodiment.

FIG. 7 is a diagram illustrating an amplifying device 100M of a modified example of the embodiment. The amplifying device 100M does not include the distributor 120 and the coupler 130 because the amplifying device 100M includes one series circuit of the buffer amplifier 110A, the linearizer 111, the DA 51, and the PA 52. Thus, the output terminal 112A2 of the coupler 112A of the gate control circuit 112 is connected to the input terminal 110A1 of the buffer amplifier 110A, and the output terminal 52B of the PA 52 is connected to the RF signal output terminal 102. The impedance between the coupler 112A and the buffer amplifier 110A is matched by a microstrip line or the like. Additionally, the impedance between the PA 52 and the RF signal output terminal 102 is matched by a microstrip line or the like.

In the amplifying device 100M, as in the amplifying device 100, the impedance between the buffer amplifier 110A and the linearizer 111 is matched to a certain extent even when the input impedance of the linearizer 111 changes. Additionally, the buffer amplifier 110A prevents the change in the input impedance of the linearizer 111 from reaching the coupler 112A that is a stage prior to the buffer amplifier 110A. Because the buffer amplifier 110A includes the FET 202 (see FIG. 6), high isolation is obtained between the input and output sides of the buffer amplifier 110A. By using such high isolation of the FET of the buffer amplifier 110A, a configuration in which the influence of the change in the input impedance of the linearizer 111 does not reach a stage prior to the buffer amplifier 110A can be achieved.

Thus, in the amplifying device 100M, as in the amplifying device 100, the Pin-Gain characteristic is flattened, and the amplifying device 100 can output the RF signal amplified with a great gain without using additional amplifier. Therefore, the size of the amplifying device 100M can be reduced by causing the reflection loss of the RF signal input from the buffer amplifier 110A to the linearizer 111 to fall within a predetermined value.

Although the amplifying device of the exemplary embodiment of the present invention has been described, the present invention is not limited to the specifically disclosed embodiment, and various alterations and modifications can be made without departing from the scope of the claims.

What is claimed is:

1. An amplifying device comprising:
a radio frequency (RF) signal input terminal to which an RF signal is input;
a buffer circuit having an input terminal connected to the RF signal input terminal, the RF signal being input to the buffer circuit through the input terminal;
a linearizer connected to an output side of the buffer circuit;
a power amplifier connected to an output side of the linearizer; and
a control circuit,
wherein the linearizer includes a transistor having a control terminal,
wherein the control circuit outputs a first gate voltage to the control terminal when a level of the RF signal input to the RF signal input terminal is a first level, the first gate voltage causing the transistor to perform a class B operation,
wherein the control circuit outputs a second gate voltage to the control terminal when the level of the RF signal input to the RF signal input terminal is a second level that is higher than the first level, the second gate voltage causing the transistor to perform a class AB operation, and
wherein an output impedance of the buffer circuit that is seen from an input side of the linearizer is set such that a reflection loss of the RF signal input from the buffer circuit to the linearizer is less than or equal to a predetermined level.

2. The amplifying device as claimed in claim 1, wherein the output impedance of the buffer circuit that is seen from the input side of the linearizer is set such that the reflection loss is less than or equal to the predetermined level by the transistor performing the class B operation, an operation between the class B operation and the class AB operation, or the class AB operation, if input impedance of the linearizer that is seen from the output side of the buffer circuit changes.

3. The amplifying device as claimed in claim 1, wherein the RF signal is a signal in an E-band, and the predetermined level of the reflection loss represents a value of an upper limit level applicable to wireless communication in the E-band.

4. The amplifying device as claimed in claim 1, wherein the buffer circuit includes a first field effect transistor (FET) that includes a first gate terminal and a first drain terminal, the first gate terminal is connected to the input terminal of the buffer circuit, and the first drain terminal is connected to an output terminal of the buffer circuit.

5. The amplifying device as claimed in claim 1,
wherein the transistor of the linearizer includes a second FET and a third FET, the second FET including a second gate terminal and a second drain terminal, and the third FET including a third gate terminal and a third drain terminal,
wherein the control circuit is connected to the input terminal of the linearizer;
wherein the second gate terminal and the third gate terminal are the control terminal;
wherein the second drain terminal and the third drain terminal are connected to an output terminal of the linearizer; and
wherein a portion between the second gate terminal and the second drain terminal of the second FET and a portion between the third gate terminal and the third drain terminal of the third FET are connected in parallel between the control terminal and the output terminal of the linearizer.

6. The amplifying device as claimed in claim 1,
wherein the control circuit includes
a directional coupler that includes an input terminal connected to the RF signal input terminal, a first output terminal connected to the input terminal of the buffer circuit, and a second output terminal,
an amplifier connected to the second output terminal,
a rectifier connected to an output side of the amplifier, and
a level shifter connected to an output side of the rectifier, and
wherein the level shifter is connected to the control terminal and outputs the first gate voltage or the second gate voltage.

7. The amplifying device as claimed in claim 6,
wherein the amplifier includes a fourth FET that includes a fourth gate terminal and a fourth drain terminal, the fourth gate terminal being connected to the second output terminal, and the fourth drain terminal being connected to the rectifier, and
wherein the fourth FET amplifies an alternating current component of a signal input to the fourth gate terminal and outputs the amplified alternating current component from the fourth drain terminal.

8. The amplifying device as claimed in claim 7,
wherein the rectifier includes
a capacitor connected to the fourth drain terminal of the fourth FET of the amplifier,
a rectifying element connected to an output side of the capacitor, and
a smoothing element connected to an output side of the rectifying element,
wherein the rectifier rectifies the amplified alternating current component input from the fourth drain terminal and outputs the rectified alternating current component to the level shifter.

9. The amplifying device as claimed in claim 8, wherein the rectifying element includes a diode, a line connecting the capacitor and the smoothing element is branched and connected to the diode, the diode is turned off when the level of the RF signal is the first level, and the diode is turned on when the level of the RF signal is the second level.

10. The amplifying device as claimed in claim 9,
wherein the level shifter includes a fifth FET that includes a fifth gate terminal and a source terminal, the fifth gate terminal is connected to an output side of the smoothing element, the source terminal is connected to the control terminal of the transistor, and the first gate voltage is generated via the source terminal, and
wherein the fifth FET is turned off when the level of the RF signal is the first level, and is turned on when the level of the RF signal is the second level.

11. The amplifying device as claimed in claim 1, further comprising:
a distributor;
a coupler; and
an RF signal output terminal,
wherein the amplifying device includes a plurality of series circuits, the buffer circuit, the linearizer, and the power amplifier being connected in series in each of the plurality of series circuits, wherein the distributor is connected between the RF signal input terminal and the input terminals of the buffer circuits, wherein the coupler is connected between the power amplifiers and the RF signal output terminal, wherein the plurality of series circuits are connected in parallel to each other between the distributor and the coupler, and wherein the control circuit outputs the first gate voltage or the second gate voltage to the control terminal of the transistor of each of the linearizers.

* * * * *